(12) United States Patent
Tamaru et al.

(10) Patent No.: US 10,393,396 B2
(45) Date of Patent: Aug. 27, 2019

(54) THERMAL LOAD ESTIMATING DEVICE AND AIR CONDITIONING CONTROL SYSTEM

(71) Applicant: Kabushiki Kaisha Toshiba

(72) Inventors: Shingo Tamaru, Kawasaki (JP); Yuuichi Hanada, Shiraoka (JP); Dai Murayama, Musashino (JP); Koji Kimura, Kawasaki (JP); Masahiko Murai, Hachioji (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 258 days.

(21) Appl. No.: 15/117,675

(22) PCT Filed: Nov. 19, 2014

(86) PCT No.: PCT/JP2014/080625
§ 371 (c)(1),
(2) Date: Aug. 9, 2016

(87) PCT Pub. No.: WO2015/118749
PCT Pub. Date: Aug. 13, 2015

(65) Prior Publication Data
US 2016/0348932 A1    Dec. 1, 2016

(30) Foreign Application Priority Data

Feb. 10, 2014    (JP) .................................. 2014-023448

(51) Int. Cl.
*F24F 11/30*      (2018.01)
*G05B 1/00*      (2006.01)
(Continued)

(52) U.S. Cl.
CPC .............. *F24F 11/30* (2018.01); *F24F 11/62* (2018.01); *G01R 22/061* (2013.01); *G01R 22/10* (2013.01);
(Continued)

(58) Field of Classification Search
CPC ........ F24F 11/46; F24F 11/64; F24F 2110/00; F24F 2140/50; F24F 2140/60
See application file for complete search history.

(56) References Cited

U.S. PATENT DOCUMENTS

| | | | | |
|---|---|---|---|---|
| 4,549,404 A | * | 10/1985 | Lord ....................... | F25B 49/02 62/224 |
| 7,007,676 B1 | * | 3/2006 | Schuricht .............. | F02D 41/222 123/359 |

(Continued)

FOREIGN PATENT DOCUMENTS

| | | |
|---|---|---|
| EP | 2 660 528 A2 | 11/2013 |
| JP | 9-273795 A | 10/1997 |

(Continued)

OTHER PUBLICATIONS

International Search Report dated Feb. 17, 2015 in PCT/JP14/080625 Filed Nov. 19, 2014.

*Primary Examiner* — Henry T Crenshaw
(74) *Attorney, Agent, or Firm* — Oblon, McClelland, Maier & Neustadt, L.L.P.

(57) ABSTRACT

According to an embodiment, a thermal load estimating device receives actual power consumption of various types of devices installed in a room, a thermal load pattern of a time-series maximum thermal load of the room, and power consumption of the various types of devices in the room; estimates a thermal load of the room at appropriate time based on the actual power consumption, the thermal load pattern, and the power consumption; and outputs an estimated thermal-load value as a result of estimation.

11 Claims, 16 Drawing Sheets

(51) Int. Cl.
 *F24F 11/46* (2018.01)
 *F24F 11/62* (2018.01)
 *F24F 11/64* (2018.01)
 *G05B 13/02* (2006.01)
 *G01R 22/06* (2006.01)
 *G01R 22/10* (2006.01)
 *F24F 11/52* (2018.01)
 *F24F 110/00* (2018.01)
 *F24F 110/70* (2018.01)
 *F24F 120/10* (2018.01)
 *F24F 140/50* (2018.01)
 *F24F 140/60* (2018.01)
 *F24F 130/30* (2018.01)

(52) U.S. Cl.
 CPC ............... *G05B 1/00* (2013.01); *G05B 13/02* (2013.01); *F24F 11/46* (2018.01); *F24F 11/52* (2018.01); *F24F 11/64* (2018.01); *F24F 2110/00* (2018.01); *F24F 2110/70* (2018.01); *F24F 2120/10* (2018.01); *F24F 2130/30* (2018.01); *F24F 2140/50* (2018.01); *F24F 2140/60* (2018.01); *G05B 2219/2614* (2013.01)

(56) References Cited

U.S. PATENT DOCUMENTS

| | | | |
|---|---|---|---|
| 2006/0111795 A1* | 5/2006 | Butler | G05B 23/027 700/19 |
| 2012/0023977 A1* | 2/2012 | Kim | H02J 3/14 62/89 |
| 2012/0111038 A1* | 5/2012 | Campbell | F25B 39/02 62/115 |
| 2013/0298574 A1* | 11/2013 | Cha | F25B 49/00 62/56 |

FOREIGN PATENT DOCUMENTS

| | | |
|---|---|---|
| JP | 2003-76935 A | 3/2003 |
| JP | 2011-27301 A | 2/2011 |
| JP | 2012-80679 A | 4/2012 |
| JP | 2012-242067 A | 12/2012 |

\* cited by examiner

FIG.17

LIST OF POWER CONSUMPTION AND THERMAL LOAD OF ROOM

TIME: 10:00

| ROOM | POWER CONSUMPTION [kWh] | ESTIMATED THERMAL-LOAD VALUE [kW] |
|---|---|---|
| ROOM 1 | 20 | 50 |
| ROOM 2 | 30 | 58 |
| ROOM 3 | 25 | 52 |
| ROOM 4 | 23 | 54 |
| ⋮ | ⋮ | ⋮ |
| ⋮ | ⋮ | ⋮ |

FIG.18

POWER CONSUMPTION AND ESTIMATED THERMAL-LOAD VALUE OF ROOM

TIME: 10:00

ROOM 1
POWER CONSUMPTION: 20[kWh]
ESTIMATED THERMAL-LOAD
VALUE: 50[kW]

ROOM 2
POWER CONSUMPTION: 30[kWh]
ESTIMATED THERMAL-LOAD
VALUE: 58[kW]

ROOM 3
POWER CONSUMPTION: 25[kWh]
ESTIMATED THERMAL-LOAD
VALUE: 52[kW]

ROOM 4
POWER CONSUMPTION: 23[kWh]
ESTIMATED THERMAL-LOAD
VALUE: 54[kW]

THERMAL LOAD ESTIMATING DEVICE AND AIR CONDITIONING CONTROL SYSTEM

CROSS-REFERENCE TO RELATED APPLICATIONS

This application is national stage application of International Application No. PCT/JP2014/080625, filed Nov. 19, 2014, which designates the United States, incorporated herein by reference, and claims priority to Japanese Patent Application No. 2014-023448, filed Feb. 10, 2014, the entire contents of which are incorporated herein by reference.

FIELD

Embodiments described herein generally relate to a thermal load estimating device and an air conditioning control system.

BACKGROUND

Of the energy consumed by the entire building facilities in offices, residences, and others, the air conditioning-related energy consumption accounts for about a half of that, and thus promoting the air conditioning-related energy saving contributes significantly to the energy saving of the building facilities. Consequently, an air-conditioning and heat source system is required to efficiently operate in accordance with the usage of a room. For the implementation of that, real-time thermal load estimation for the room needs to be achieved. To date, in terms of air conditioning-related energy saving, numerous thermal load estimating devices have been developed, including, for example, one that prepares a standard thermal load pattern in advance and estimates the thermal load.

Such conventional techniques, however, prepare thermal load patterns for a target building in advance to estimate the thermal load and cannot estimate momentarily varying thermal load of the target building in real time.

An object of the present invention is to provide a thermal load estimating device and an air conditioning control system that are capable of estimating a thermal load in units of a room in real time.

BRIEF DESCRIPTION OF DRAWINGS

FIG. 17 is a diagram illustrating an example of a display screen showing a list of estimated thermal-load values according to the seventh embodiment;

FIG. 18 is a diagram illustrating an example of a display screen showing the estimated thermal-load values in a plan view according to the seventh embodiment.

According to an embodiment, a thermal load estimating device receives actual power consumption of various types of devices installed in a room, a thermal load pattern of a time-series maximum thermal load of the room, and power consumption of the various types of devices in the room; estimates a thermal load of the room at appropriate time based on the actual power consumption, the thermal load pattern, and the power consumption; and outputs an estimated thermal-load value as a result of estimation.

DETAILED DESCRIPTION

With reference to the accompanying drawings, the following describes various exemplary embodiments of a thermal load estimating device in an air conditioning control system.

First Embodiment

Figure 1:
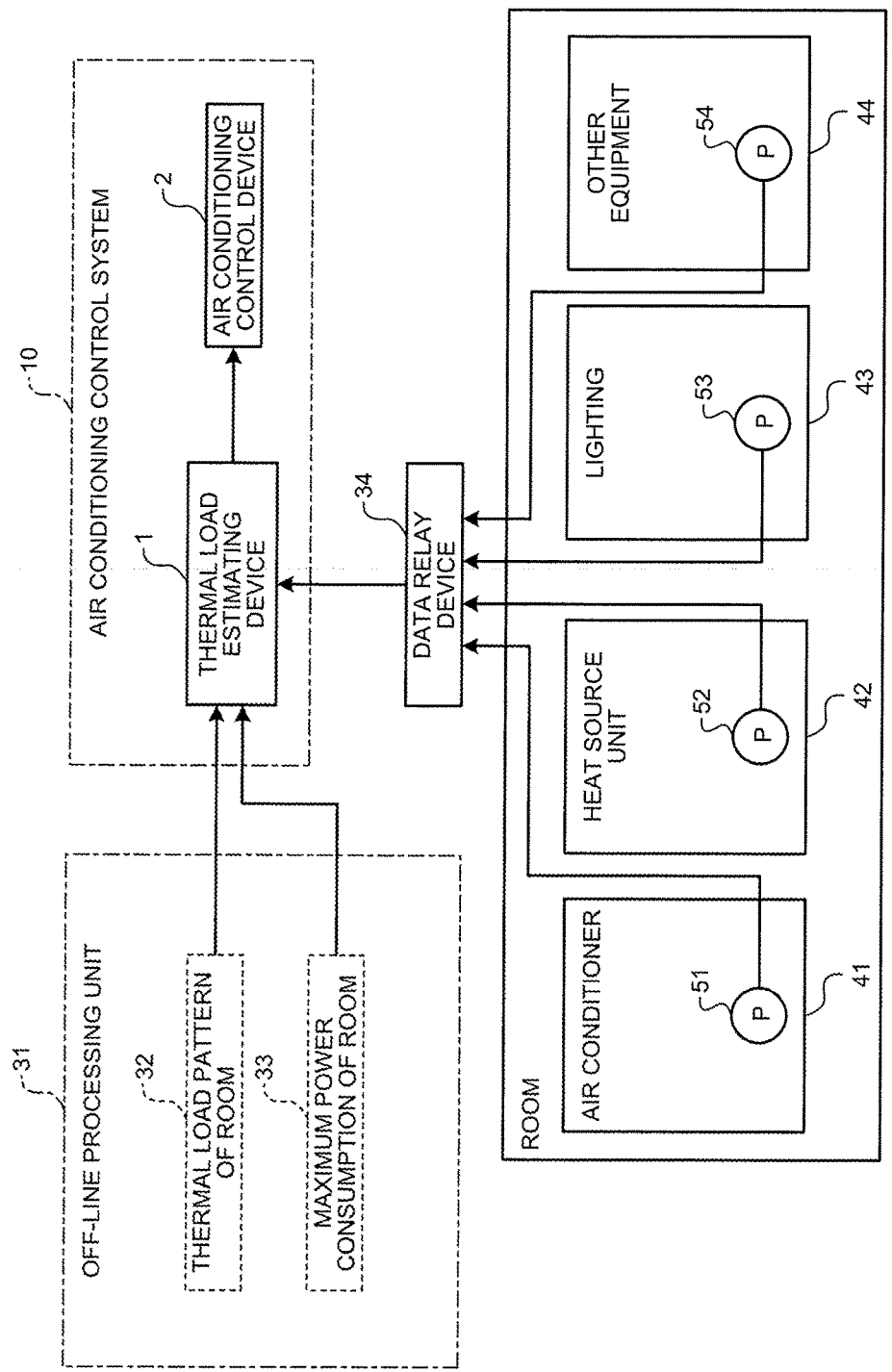
FIG. 1 is a configuration diagram of a system including an air conditioning control system including a thermal load estimating device and various types of devices associated with the thermal load estimating device according to a first embodiment.

FIG. 1 is a configuration diagram of a system that includes an air conditioning control system 10 including a thermal load estimating device 1 according to a first embodiment and various types of devices associated with the thermal load estimating device 1. As illustrated in FIG. 1, the system includes the air conditioning control system 10 including the thermal load estimating device 1 and an air conditioning control device 2, and an off-line processing unit 31, a data relay device 34, an air conditioner 41, a heat source unit 42, a lighting (lighting device) 43, and an additional device 44.

On the air conditioner 41, a watt-hour meter 51 that measures the power consumption thereof is installed. On the heat source unit 42, a watt-hour meter 52 that measures the power consumption thereof is installed. On the lighting 43, a watt-hour meter 53 that measures the power consumption thereof is installed. On the additional device 44, a watt-hour meter 54 that measures the power consumption thereof is installed. The meters measure their respective power consumption.

The data relay device 34 acquires the power consumption of the air conditioner 41, the heat source unit 42, the lighting 43, and the additional device 44 from the respective watt-hour meters 51, 52, 53, and 54, and transmits a total value thereof to the thermal load estimating device 1.

The off-line processing unit 31 generates a thermal load pattern 32 of a room and calculates maximum power consumption 33 in the room offline. The off-line processing unit 31 is a processing unit separated from the air conditioning control system 10. The data of the generated thermal load pattern 32 for the room and that of the calculated maximum power consumption 33 of the room are separately held. The thermal load pattern 32 of the room refers to time-series data of the maximum thermal load of the room per day generated based on a thermal-load calculation sheet, for example. The thermal-load calculation sheet shows a thermal load calculated from ambient conditions such as temperature or insolation and from room conditions such as room floor space and volume, exterior wall structure, the number of occupants, lighting, and others, and lists the maximum thermal load of the room typically used for designing air conditioning equipment. The maximum power consumption 33 of the room refers to a total value of the maximum power consumption of the various types of devices installed in the room calculated from the rated values and the like of the air conditioner 41, the heat source unit 42, the lighting 43, and the additional device 44.

In the first embodiment, the room is defined to be a minimum indoor space the power consumption of which can be measured. For example, in case of a building, when only the entire building can be a subject of power consumption measurement, the entire building is referred to as a room. An indoor space with no partitions is also referred to as a room when there are a number of minimum indoor spaces the power consumption of which can be measured.

The thermal load estimating device 1 receives the thermal load pattern 32 of the room generated off-line, the maximum power consumption 33 of the room calculated off-line, and the total value of the power consumption of the various types of devices transmitted from the data relay device 34, and estimates the thermal load of the room (details will be described later).

The air conditioning control device 2 receives an estimated thermal-load value of the room from the thermal load estimating device 1 and controls the air-conditioning and heat source system including the air conditioner 41 and the heat source unit 42.

In the example illustrated in FIG. 1, the data relay device 34 transmits the total sum of the power consumption of the room measured by the watt-hour meters (51, 52, 53, 54) of the respective devices to the thermal load estimating device 1. However, it may be configured such that the respective devices individually transmit their power consumption to the thermal load estimating device 1 and the thermal load estimating device 1 adds up the power consumption. Alternatively, an additional watt-hour meter may be provided to measure the overall power consumption (equivalent to the total value) of the air conditioner 41, the heat source unit 42, the lighting 43, and the additional device 44, and the data relay device 34 may acquire the overall power consumption of the respective devices from this watt-hour meter and transmits the data thereon to the thermal load estimating device 1. The thermal load pattern 32 of the room is generated based on the thermal-load calculation sheet. However, it should not be limited thereto, and the thermal load pattern can be arbitrarily generated as long as it represents the maximum power consumption of the various types of devices installed in the room.

Figure 2:
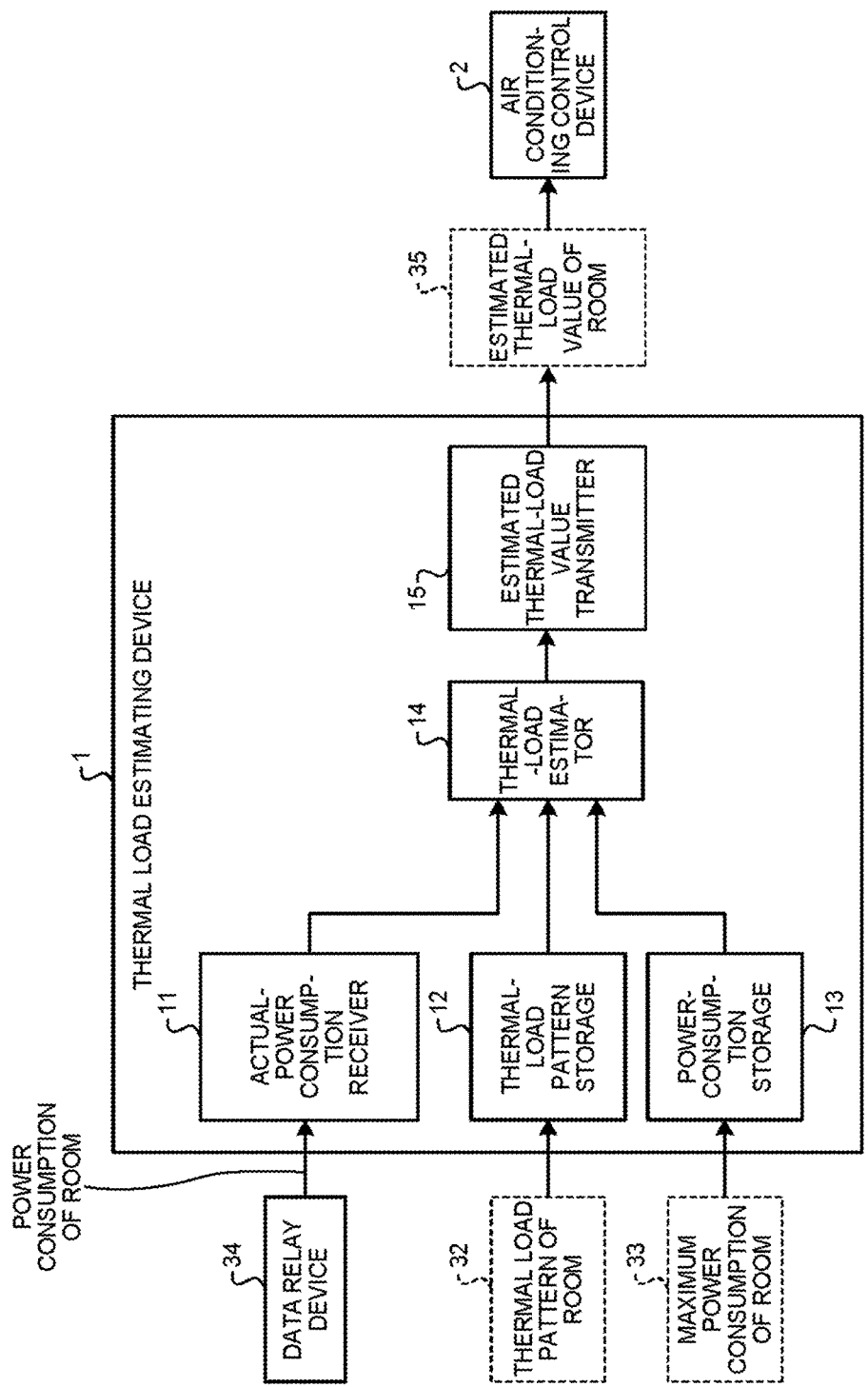
FIG. 2 is a block diagram illustrating a schematic configuration of the thermal load estimating device in the first embodiment.

Next, with reference to FIG. 2, the configuration of the thermal load estimating device 1 in the first embodiment will be described.

The thermal load estimating device 1 includes an actual-power consumption receiver 11, a thermal-load pattern storage 12, a power-consumption storage 13, a thermal-load estimator 14, and an estimated thermal-load value transmitter 15.

The actual-power consumption receiver 11 receives the power consumption of the room from the data relay device 34.

The thermal-load pattern storage 12 stores therein the thermal load pattern 32 of the room generated by the off-line processing unit 31.

The power-consumption storage 13 stores therein the maximum power consumption 33 of the room calculated by the off-line processing unit 31.

The thermal-load estimator 14 acquires the power consumption of the room from the actual-power consumption receiver 11, acquires the thermal load pattern for the room from the thermal-load pattern storage 12, acquires the maximum power consumption of the room from the power-consumption storage 13, and estimates the thermal load of the room (details will be described later).

The estimated thermal-load value transmitter 15 transmits the estimated thermal-load value estimated by the thermal-load estimator 14 to the air conditioning control device 2 as an estimated thermal-load value 35 of the room.

Next, a specific example of a room thermal-load estimating method will be described.

[Step 1]

First, the off-line processing unit 31 generates the thermal load pattern 32 for the room. In this step, the thermal load pattern of the room on one day is generated from the thermal-load calculation sheet. As in the foregoing, the thermal-load calculation sheet lists a human-body thermal load, a lighting thermal load, a general-device thermal load, and other thermal loads (such as an insolation load). From a total value of the loads, the thermal load pattern 32 of the room on one day is generated. The thermal load pattern 32 of the room refers to the maximum power consumption of the room, and the thermal load of the room is herein estimated under the following conditions.

The orientation of windows in the room is assumed to be southward.

The thermal-load calculation sheet contains thermal loads of the room at 9:00, 12:00, 14:00, and 16:00.

At the time other than the hour (such as 8:30), the thermal load is assumed to be equal to that of the hour immediately before.

The thermal load of the room at the hour other than 9:00, 12:00, 14:00, and 16:00 is calculated by interpolation using the thermal load data for one hour or two hours before the hour of interest and the thermal load data for one hour or two hours after the hour of interest.

Figure 3:
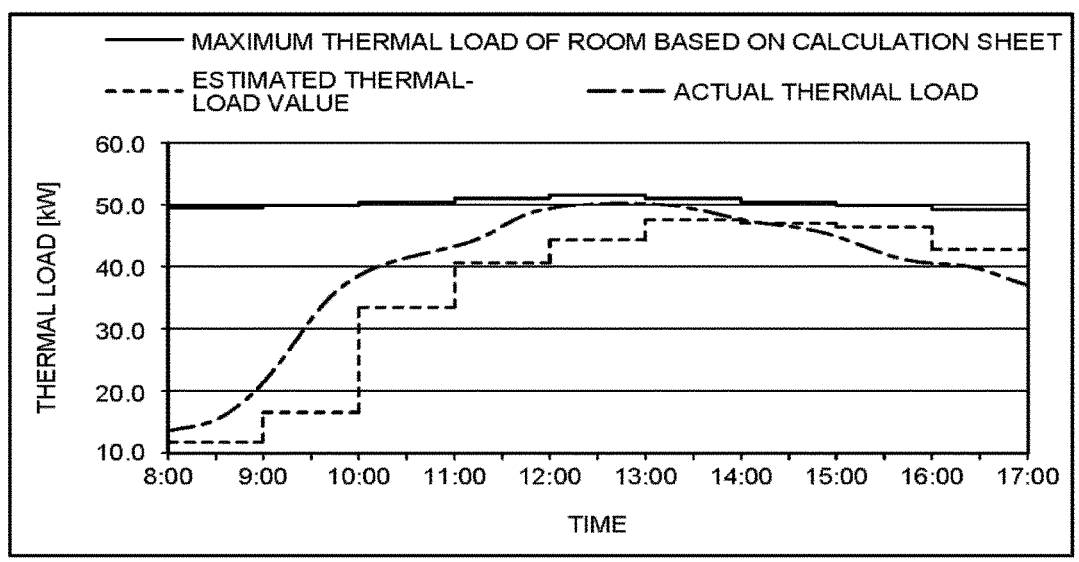
FIG. 3 is a chart illustrating an example of a maximum thermal load of a room based on a thermal-load calculation sheet, and an estimated thermal-load value and an actual thermal load of the room according to the first embodiment.
Figure 4:
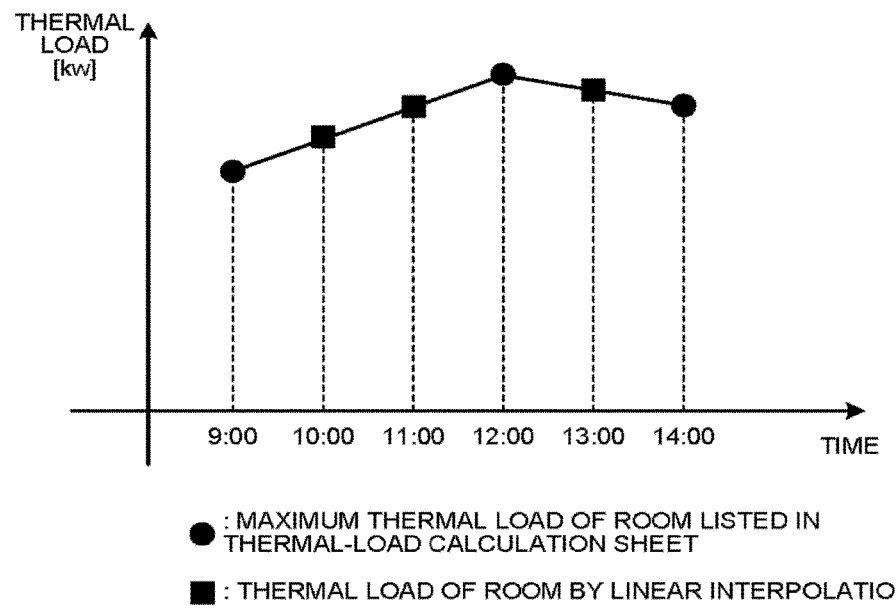
FIG. 4 is a diagram for explaining a method of generating a thermal load pattern of the room according to the first embodiment.

The thermal load pattern 32 of the room from 8:00 to 17:00 calculated under the above-described conditions is represented by the solid line in FIG. 3. The thermal load pattern 32 of the room reaches the peak between 12:00 and 13:00 because the room in this example directs southward. This may be because the thermal load of the room is increased due to the insolation load of the sun. The dashed-dotted line in FIG. 3 represents actual thermal load. As illustrated in FIG. 4, the thermal load pattern of the room in this example is generated by calculating a maximum thermal load for the time that is not listed in the thermal-load calculation sheet by linear interpolation based on the maximum thermal loads of the room listed in the thermal-load calculation sheet.

[Step 2]

Next, the off-line processing unit 31 calculates the maximum power consumption 33 of the room. Specifically, it calculates the maximum power consumption of the various types of devices installed in the room. As illustrated in FIG. 1, the total value of the respective rated power consumption of the air conditioner 41, the heat source unit 42, the lighting 43, and the additional device 44 installed in the room is defined as the maximum power consumption of the room. In this example, the maximum power consumption 33 (Emax) is calculated by the following Expression (1), for example.

Maximum power consumption 33 ($E$max)=Air-conditioner rated power ($E$airmax)+Heat source unit rated power ($E$heatmax)+Lighting rated power ($E$lightmax)+Additional device rated power ($E$etcmax)     (1)

[Step 3]

Next, the thermal-load estimator 14 estimates the thermal load. The thermal-load estimator 14 estimates the thermal load of the room based on the thermal load pattern 32 obtained at STEP 1, the maximum power consumption 33 calculated at STEP 2, and the power consumption of the room received from the actual-power consumption receiver 11. The thermal load of the room at 10:00 is estimated by the following Expression (2) and Expression (3), for example.

Estimated thermal-load value at 10:00=Thermal load of the room at 10:00 in the thermal load pattern 32×Power consumption ($E$) between 9:00 and 10:00/Maximum power consumption 33 ($E$max)     (2)

Power consumption ($E$)=Air-conditioner power consumption ($E$air)+Heat-source unit power consumption ($E$heat)+Lighting power consumption ($E$light)+Additional device power consumption ($E$etc)     (3)

The thermal-load calculation sheet contains the maximum thermal load of the room. Thus, the thermal-load estimator 14 estimates the thermal load of the room from a ratio (E/Emax) of previous actual power consumption (E), and the maximum power consumption 33 (Emax). In Expression (2), for example, for estimating the thermal load at 10:00, the use of the actual power consumption at 9:00 immediately before 10:00 makes it possible to estimate the thermal load in real time (at appropriate time).

The dotted line in FIG. 3 represents the estimated thermal load of the room from 8:00 to 17:00 based on the result of the calculation at STEP 3. It is found from FIG. 3 that in the morning the estimated thermal-load value is small because of a few number of occupants in the room and small power consumption early in the morning. Meanwhile, it is found that in the afternoon the estimated thermal-load value of the room is large because of increased power consumption of the air-conditioner and other devices and increased power consumption of the room. In the first embodiment, because the thermal load pattern 32 of the room varies every one hour, the actual-power consumption receiver 11 receives the actual power consumption every one hour and estimates the thermal load in a one-hour cycle.

Figure 5:
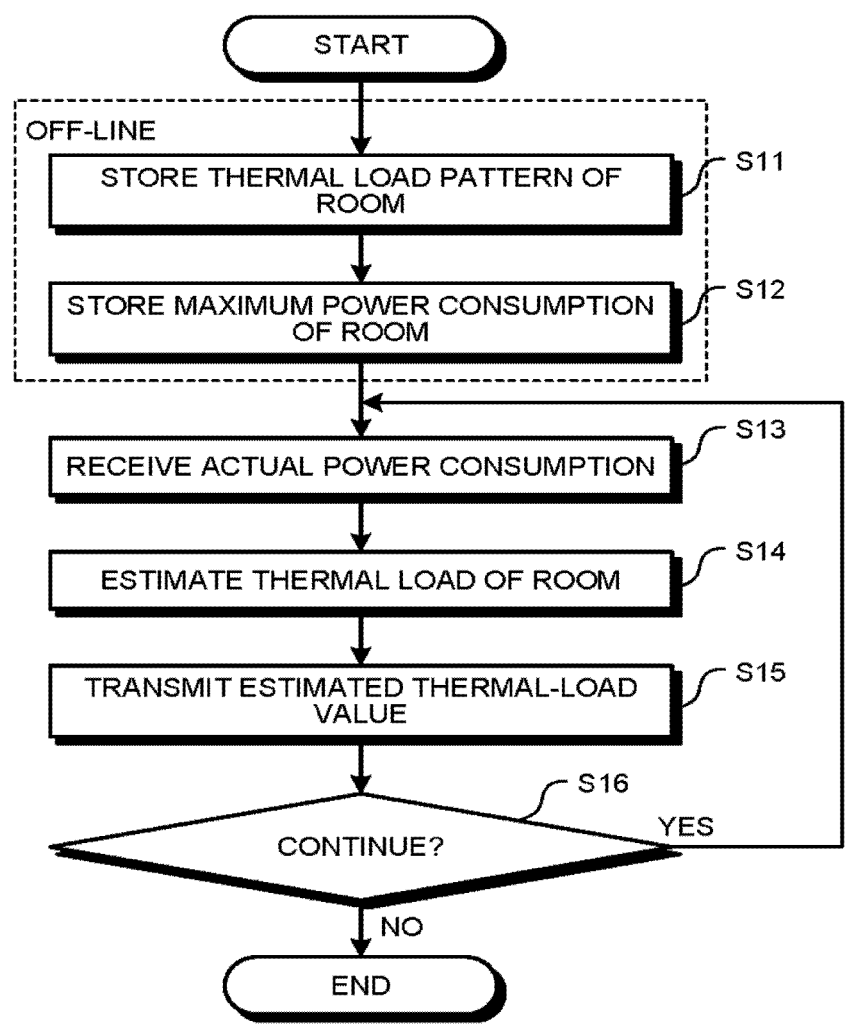
FIG. 5 is a flowchart of processing in the thermal load estimating device in the first embodiment.

Next, the operation of the thermal load estimating device 1 in the first embodiment will be described. FIG. 5 is a flowchart of processing in the thermal load estimating device 1.

First, the thermal load estimating device 1 stores, off-line, the thermal load pattern of the room in the thermal-load pattern storage 12 (S11), and stores the maximum power consumption of the room in the power-consumption storage 13 (S12). The thermal load pattern and the maximum power consumption are generated or calculated by the off-line processing unit 31.

Next, to estimate the thermal load of the room, the actual-power consumption receiver 11 receives the actual power consumption of the room from the data relay device 34 (S13).

Subsequently, based on the thermal load pattern of the room in the thermal-load pattern storage 12 and the maximum power consumption of the room in the power-consumption storage 13, which are stored off-line in advance, and the actual power consumption of the room, the thermal-load estimator 14 estimates the thermal load of the room by the foregoing thermal-load estimating method (S14).

Upon completion of the estimation, the estimated thermal-load value transmitter 15 transmits the estimated thermal-load value of the room to the air conditioning control device 2 (S15).

Lastly, the estimated thermal-load value transmitter 15 determines whether to continue the processing (S16). Upon determining to continue the processing (Yes), it returns to S13. Upon determining not to continue (for example, in case of anomaly) (No), it ends the series of processing.

As explained in the foregoing, the thermal load estimating device 1 in the first embodiment can estimate the thermal load of the room in real time from the thermal load pattern of the room on one day generated off-line, the maximum power consumption of the room calculated off-line, and the power consumption of the room as the actual power consumption of the various types of devices. Furthermore, the thermal load estimating device 1 in the first embodiment can estimate the thermal load of the room easily, simply using the thermal load pattern generated at the time of designing the air conditioning equipment, the maximum power consumption obtainable from the rated values of the devices of the air-conditioning and heat source system, and typically measured power consumption. Moreover, the thermal load estimating device 1 in the first embodiment can estimate the thermal load in units of a room in real time, which can be used for visualization of the state of the room. Furthermore, the thermal load estimating device 1 in the first embodiment only uses the thermal load pattern, the maximum power consumption of the room, and the power consumption of the room for the estimation of the thermal load, and it can thus accommodate to a variety of buildings and rooms.

In the first embodiment, the off-line processing unit 31 generates the thermal load pattern 32 of the room on one day from the thermal-load calculation sheet. However, in a situation that the lighting 43 is turned off in a building during a lunch break for operational reason, the off-line processing unit 31 generates in advance the thermal load pattern 32 of the room with no thermal load of the lighting 43 during the lunch break, for example. Thus, the thermal load can be accurately estimated by generating the thermal load pattern 32 of the room in accordance with the operation patterns of the various types of devices if they are predetermined.

Figure 6:
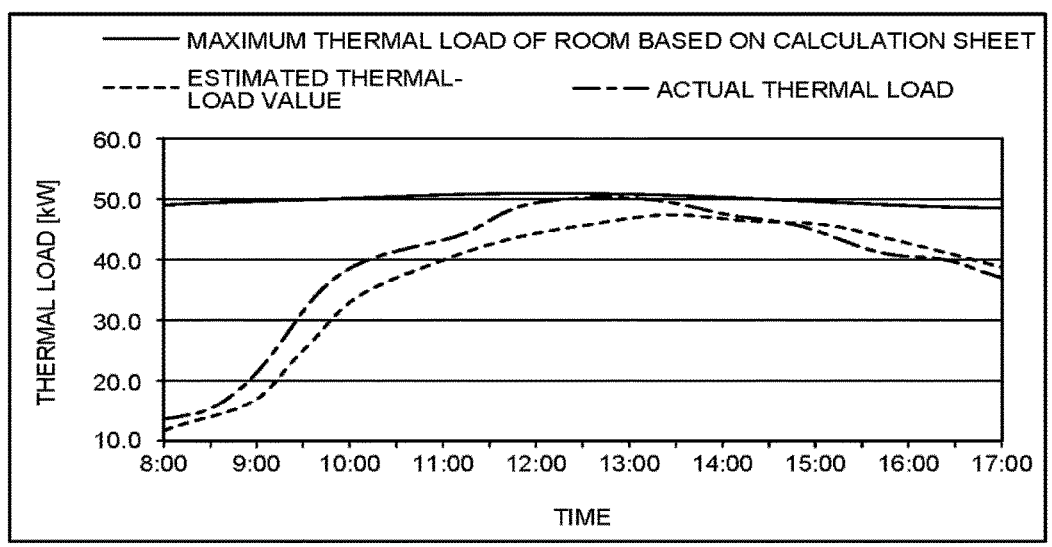
FIG. 6 is a chart illustrating, in increments of 10 minutes, examples of a maximum thermal load of the room based on the thermal-load calculation sheet, and the estimated thermal-load value and the actual thermal load of the room according to the first embodiment.

In the first embodiment, for the generation of the thermal load pattern 32 of the room by the off-line processing unit 31, the thermal load at the time other than the hour (such as 8:30) is assumed to be equal to the thermal load of the room at the hour. However, the thermal load pattern 32 of the room may be generated in increments of 30 minutes or 10 minutes by linear interpolation. For example, the solid line in FIG. 6 represents the thermal load pattern 32 of the room generated in increments of 10 minutes by linear interpolation. It is found that the line indicating the thermal load pattern 32 varies more smoothly than that in FIG. 3. The dashed-dotted line in FIG. 6 represents actual thermal load. The actual-power consumption receiver 11 receives the actual power consumption with a 10-minute cycle, which makes it possible to estimate the thermal load of the room with the 10-minute period. The dotted line in FIG. 6 represents the result of the thermal load estimation for the room (estimated thermal-load value) with the 10-minute cycle. It is found that the estimated thermal-load value varies more smoothly than that in FIG. 3.

Furthermore, the first embodiment uses the power consumption [kWh] of the room during a certain period of time, as described above. For example, in case of one-hour period, for estimating the thermal load of the room at 10:00, the power consumption [kW] at 10:00 is considered to numerically match the power consumption [kWh] during the one-hour period. Consequently, by calculating the thermal load of the room using the power consumption during a shorter period of time, the thermal load of the room can be estimated more minutely. In this case, by calculating the power consumption [kW] at 10:00 from the power consumption during the period from 9:50 to 10:00, more accurate estimated thermal-load values can be obtained.

In the first embodiment, when generating the thermal load pattern 32 of the room, the off-line processing unit 31 calculates the thermal load at the hour not listed in the thermal-load calculation sheet by linear interpolation using the thermal load data for one hour or two hours before and after the hour of interest. However, the thermal load at the hour not listed in the thermal-load calculation sheet may be calculated by interpolation using polynomial or a spline curve, for example. The thermal load estimation period does not have to be one hour and can be 10 minutes, for example, and the thermal load at the hour not listed in the thermal-load calculation sheet may be calculated with 10-minute cycle in the same manner.

Second Embodiment

Figure 7:
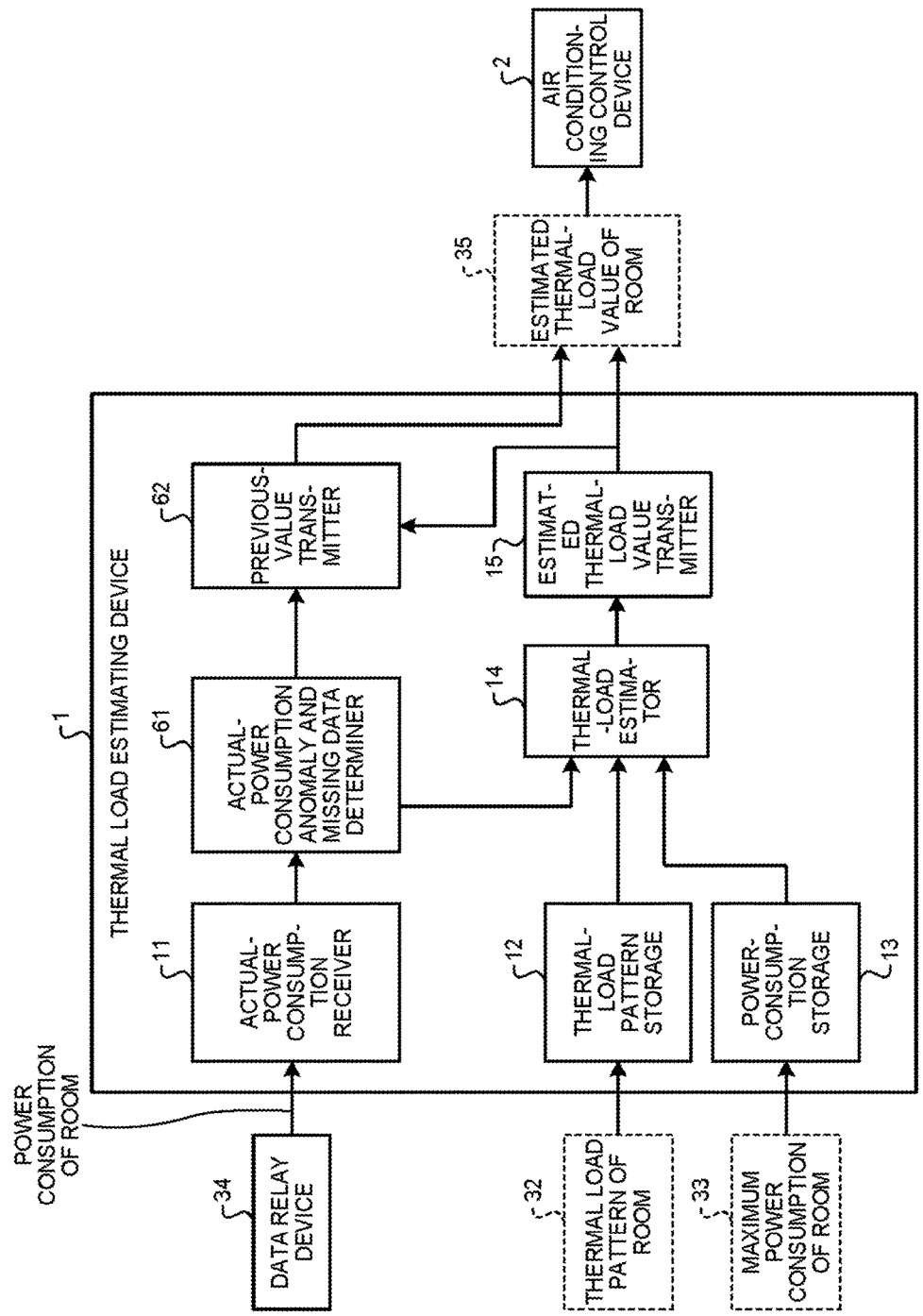
FIG. 7 is a block diagram illustrating a schematic configuration of a thermal load estimating device according to a second embodiment.
Figure 8:
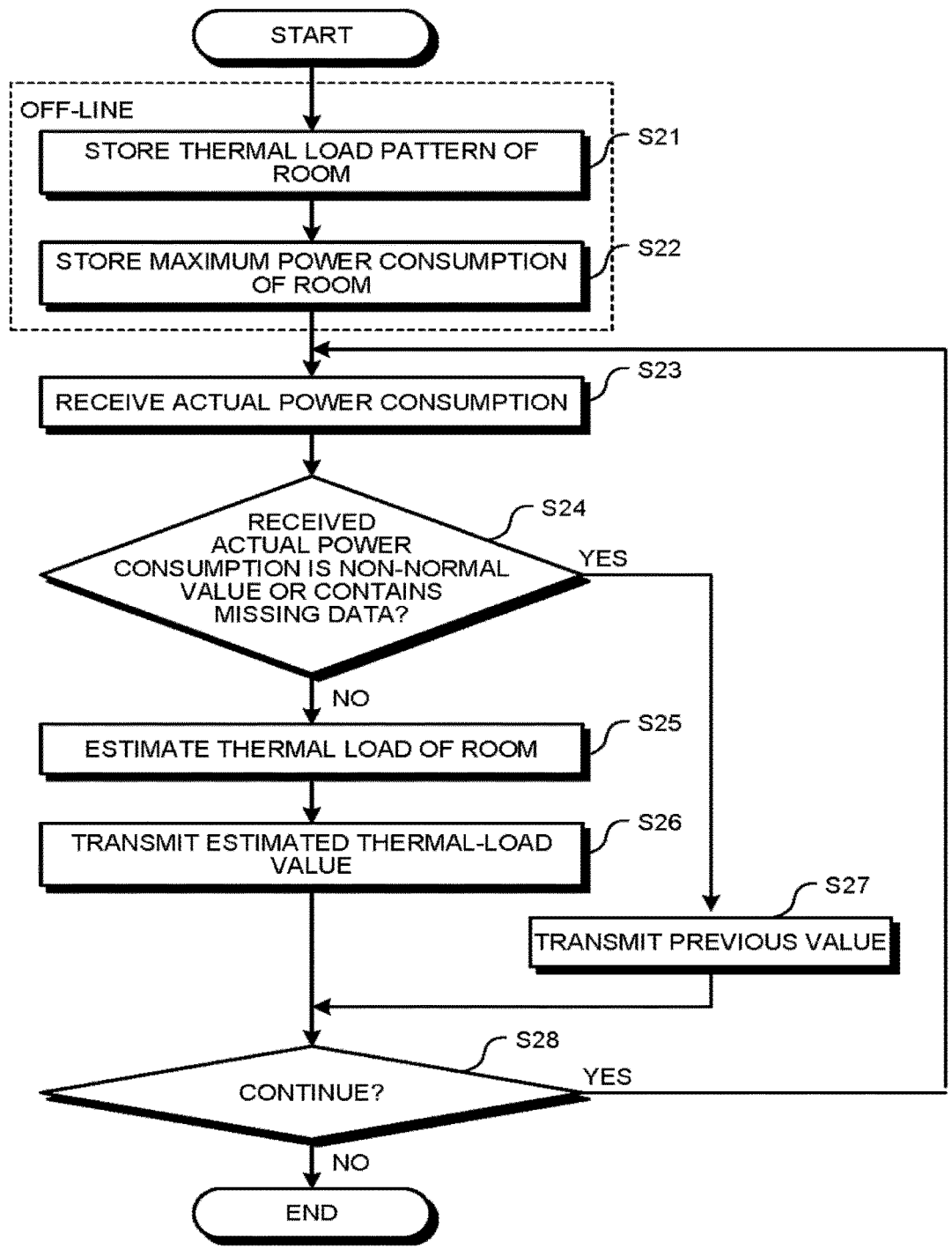
FIG. 8 is a flowchart of processing in the thermal load estimating device in the second embodiment.

Next, with reference to FIGS. 7 and 8, a second embodiment will be described. Note that the functional elements identical to those illustrated in FIG. 2 and described in the first embodiment are given the same reference signs and their explanations are omitted.

The thermal load estimating device 1 in the second embodiment includes the actual-power consumption receiver 11, the thermal-load pattern storage 12, the power-consumption storage 13, the thermal-load estimator 14, the estimated thermal-load value transmitter 15, an actual-power consumption anomaly and missing data determiner 61, and a previous-value transmitter 62.

The actual-power consumption anomaly and missing data determiner 61 determines whether the power consumption of the room received by the actual-power consumption receiver 11 is a non-normal value or contains missing data. For example, an upper limit and a lower limit of the power consumption of the room are pre-defined for anomaly determination, and the power consumption of the room received from the actual-power consumption receiver 11 equal to or higher than the upper limit or equal to or lower than the lower limit is determined to be a non-normal value. As for the missing data, a sensor is provided to determine whether the power consumption of the room received from the actual-power consumption receiver 11 contains missing data.

The previous-value transmitter 62 stores an estimated thermal-load value previously transmitted from the estimated thermal-load value transmitter 15. When the actual-power consumption anomaly and missing data determiner 61 determines that the power consumption of the room is a non-normal value or contains missing data, the previous-value transmitter 62 transmits the previous estimated thermal-load value to the air conditioning control device 2.

Next, with reference to FIG. 8, the operation of the thermal load estimating device 1 in the second embodiment will be described. FIG. 8 is a flowchart of processing in the thermal load estimating device 1 in the second embodiment.

First, the thermal load estimating device 1 stores, off-line, a thermal load pattern of the room in the thermal-load pattern storage 12 (S21) and the maximum power consumption of the room in the power-consumption storage 13 (622). The thermal load pattern and the maximum power consumption are generated or calculated by the off-line processing unit 31.

Next, to estimate the thermal load of the room, the actual-power consumption receiver 11 receives the actual power consumption of the room (S23).

Then, the actual-power consumption anomaly and missing data determiner 61 determines whether the received actual power consumption is a non-normal value or contains missing data (S24).

If the received actual power consumption is not a non-normal value or contains no missing data (No at S24), the thermal-load estimator 14 estimates the thermal load of the room based on the thermal load pattern of the room stored in the thermal-load pattern storage 12 off-line, the maximum power consumption of the room stored in the power-consumption storage 13, and the actual power consumption of the room (S25). This estimating method is the same as that in the first embodiment.

Upon completion of the estimation, the estimated thermal-load value transmitter 15 transmits the estimated thermal-load value of the room (S26).

Meanwhile, if the received actual power consumption is a non-normal value or contains missing data (Yes at S24), the previous-value transmitter 62 transmits to the air conditioning control device 2 a previously transmitted estimated thermal-load value (previous value) that has been stored (S27). Alternatively, it may be configured such that the thermal-load estimator 14 estimates the current thermal load of the room using the actual power consumption of the room in the previous estimation, and the thermal load pattern of the room stored off-line in the thermal-load pattern storage 12, and the maximum power consumption of the room stored in the power-consumption storage 13, and the previous-value transmitter 62 then transmits the result of the estimation to the air conditioning control device 2.

Lastly, the thermal load estimating device 1 determines whether to continue the processing (S28). Upon determining to continue the processing (Yes), it returns to S23. Upon determining not to continue the processing (for example, if a certain level or more of anomaly or missing data occurs) (No), it ends the series of processing.

As explained in the foregoing, in the second embodiment as in the first embodiment, the thermal load estimating device 1 can estimate the thermal load of the room in real time using the thermal load pattern of the room on one day generated off-line, the maximum power consumption of the room calculated off-line, and the actual power consumption of the room. In addition, when the actual power consumption is a non-normal value or includes missing data, the thermal load estimating device 1 in the second embodiment can transmit a previously transmitted estimated thermal-load value to the air conditioning control device 2. Thereby, the air conditioning control system 10 with higher reliability than that in the first embodiment can be provided.

Third Embodiment

Figure 9:
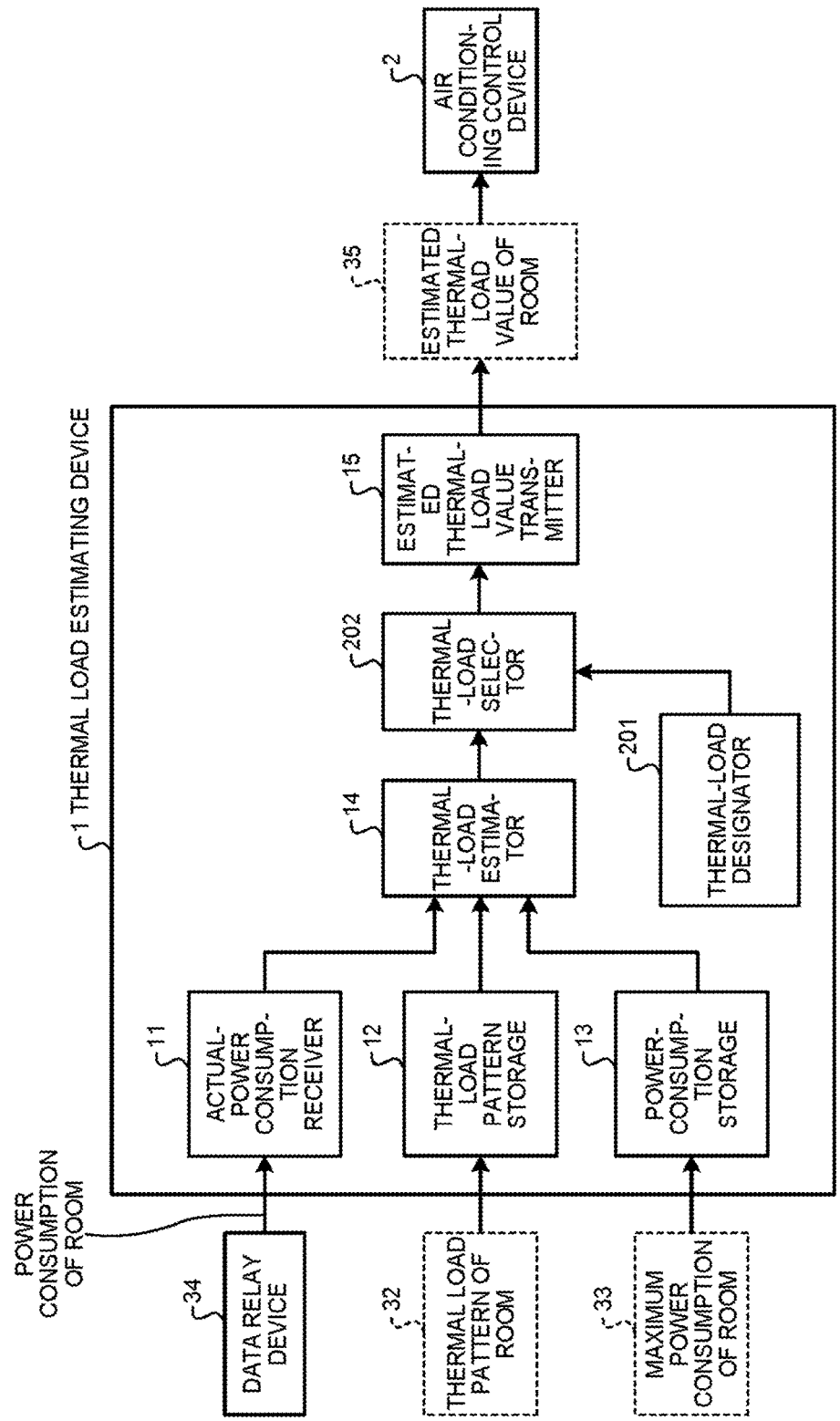
FIG. 9 is a block diagram illustrating a schematic configuration of a thermal load estimating device according to a third embodiment.

Next, with reference to FIG. 9, a third embodiment will be described. In the third embodiment, the functional elements identical to those illustrated in FIG. 2 and described in the first embodiment are also given the same reference signs, and their explanations are omitted.

The thermal load estimating device 1 in the third embodiment includes the actual-power consumption receiver 11, the thermal-load pattern storage 12, the power-consumption storage 13, the thermal-load estimator 14, the estimated thermal-load value transmitter 15, a thermal-load designator 201, and a thermal-load selector 202.

The thermal-load designator 201 designates a specific time period and a thermal load during the specific time period. The specific time period refers to office hours such as 8:00 in an office building, for example. If the office hours are constant irrespective of a day of the week or season, the entry and exit of people to/from the room are basically the same regardless of the day or season, thus, the thermal load of the room during the office hours is assumed to be unchanged every day. For this reason, the thermal-load designator 201 defines the time period for which the estimated thermal-load value by the thermal-load estimator 14 is not used and designates and uses the thermal load during this time period as the estimated thermal-load value of the room. With a schedule of air-conditioner use set for each time period, for example, the thermal-load designator 201 may be configured to extract the time period in which the thermal estimated value is not used from the schedule and designate the thermal load during this time period.

The thermal-load selector 202 receives the estimated thermal-load value from the thermal-load estimator 14, and receives the specific time period and the thermal load during the specific time period from the thermal-load designator 201. Then, in the specific time period received from the thermal-load designator 201, the thermal-load selector 202 selects the thermal load designated by the thermal-load designator 201 and transmits such data to the estimated thermal-load value transmitter 15. Meanwhile, in the time period not designated by the thermal-load designator 201, the thermal-load selector 202 selects the estimated thermal-load value estimated by the thermal-load estimator 14 and transmits such data to the estimated thermal-load value transmitter 15.

The estimated thermal-load value transmitter 15 transmits the estimated thermal-load value received from the thermal-load selector 202 to the air conditioning control device 2 as the estimated thermal-load value 35 of the room.

In the third embodiment, the office hours are defined as the specific time period. However, the time period for which weekly meetings and conferences are held outside the room to be under air conditioning control may be designated to designate the thermal load during this time period. It can be assumed that people are moving and no one is present in the room to be air-conditioning controlled during the meeting as the designated time period. Thus, by designating the thermal load of the room excluding in advance the thermal load of the air conditioning and lighting, the thermal load estimating device 1 can estimate the thermal load with higher accuracy.

Fourth Embodiment

Next, with reference to FIGS. 10 and 11, a fourth embodiment will be described. The functional elements identical to those illustrated in FIG. 2 and described in the first embodiment are given the same reference signs and their explanations are omitted.

Figure 10:
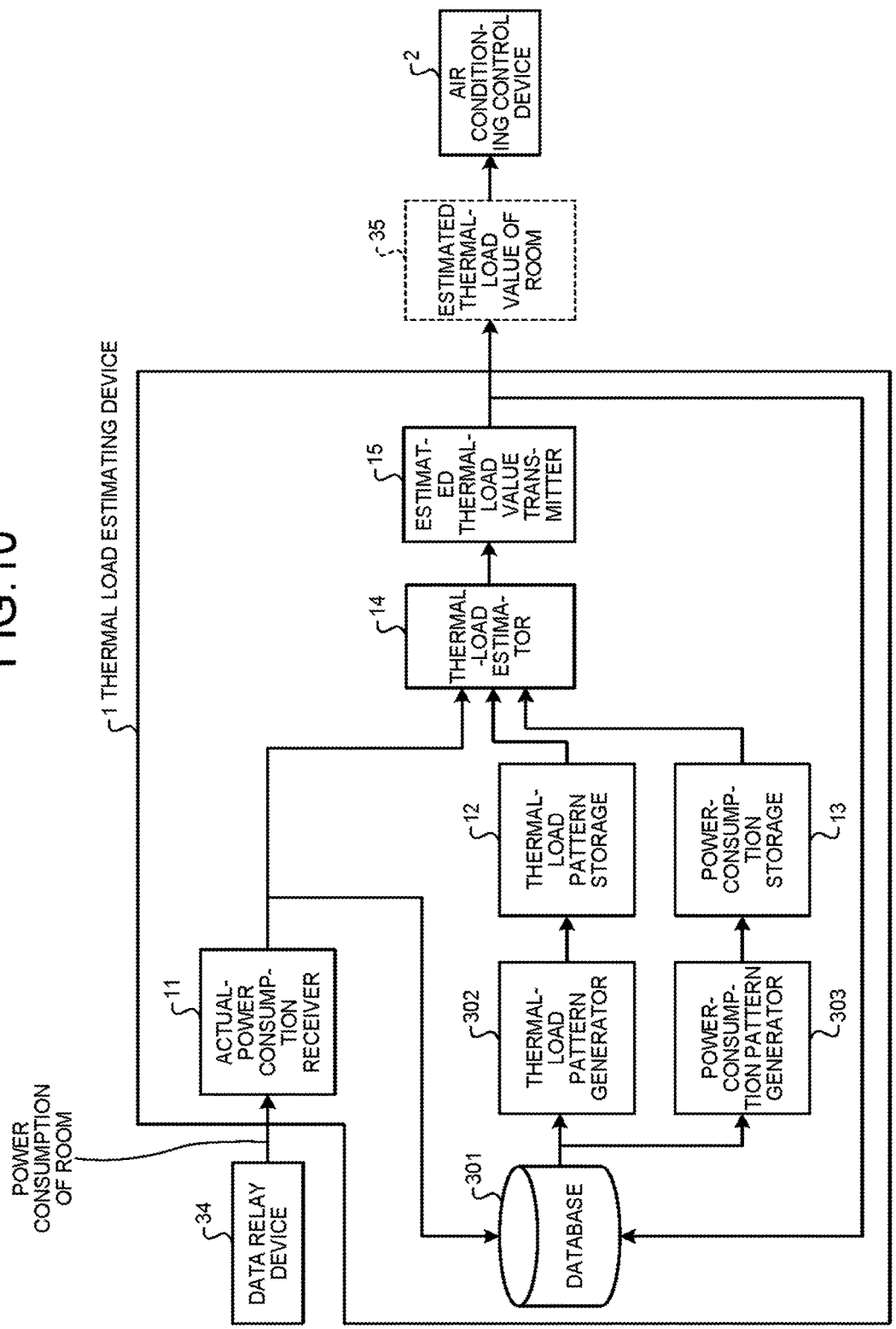
FIG. 10 is a block diagram illustrating a schematic configuration of a thermal load estimating device according to a fourth embodiment.
Figure 11:
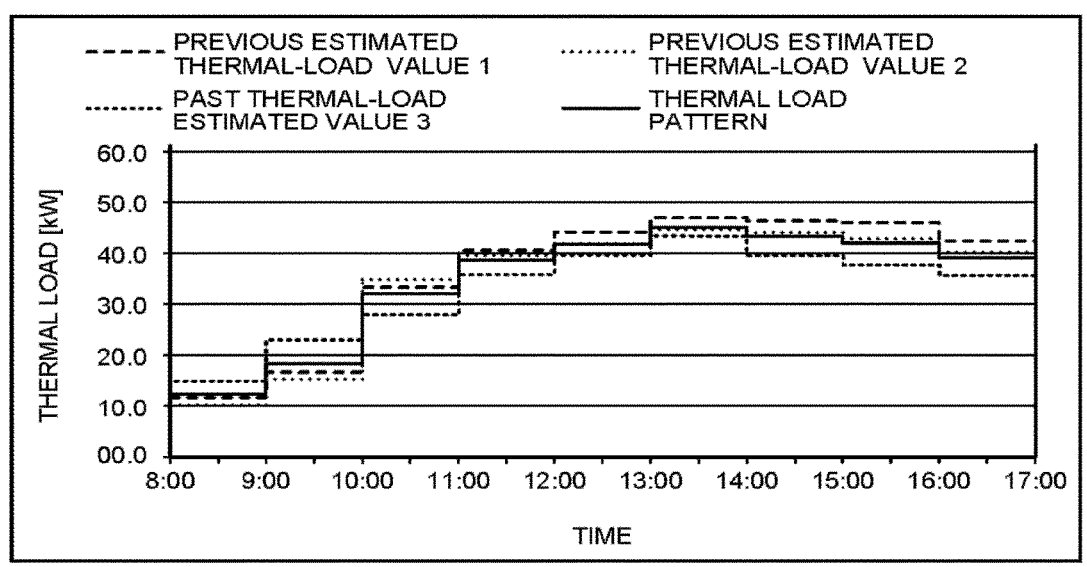
FIG. 11 is a chart illustrating an example of generation of a thermal load pattern of a room according to the fourth embodiment.

As illustrated in FIG. 10, the thermal load estimating device 1 in the fourth embodiment includes the actual-power consumption receiver 11, the thermal-load pattern storage 12, the power-consumption storage unit 13, the thermal-load estimator 14, the estimated thermal-load value transmitter 15, a database 301, a thermal-load pattern generator 302, and a power-consumption pattern generator 303.

The database 301 receives as needed the power consumption of the room from the actual-power consumption receiver 11 and the estimated thermal-load value 35 of the room from the estimated thermal-load value transmitter 15, and stores them as actual values of the past. As one example, the database 301 stores therein the power consumption and the estimated thermal-load values of the room on the past three days.

The thermal-load pattern generator 302 generates a thermal load pattern on one day from the previous estimated thermal-load values of the room stored in the database 301. The thermal load pattern from 8:00 to 17:00 generated by the thermal-load pattern generator 302 is illustrated in FIG. 11. The thermal-load pattern generator 302 calculates the average value of the previous estimated thermal-load values 1, 2, and 3 stored in the database 301, as illustrated in FIG. 11, to generate the thermal load pattern on one day, for example.

The power-consumption pattern generator 303, as the processing by the thermal-load pattern generator 302, calculates the average value of the past power consumption stored in the database 301 to generate a power consumption pattern on one day.

The thermal-load pattern storage 12 stores therein the thermal load pattern generated by the thermal-load pattern generator 302. The power-consumption storage 12 stores therein the power consumption pattern generated by the power-consumption pattern generator 303.

The thermal-load estimator 14 receives the power consumption of the room from the actual-power consumption receiver 11, receives the thermal load pattern of the room from the thermal-load pattern storage 12, receives the power consumption pattern of the room from the power-consumption storage 12, and estimates the thermal load of the room. In the fourth embodiment, the thermal load of the room is estimated by the following Expression (4), for example. Expression (4) represents, as in the first embodiment, the estimation of the thermal load at 10:00 by way of example.

$$\begin{aligned}\text{Estimated thermal-load value at 10:00} &= \text{Thermal load} \\ &\text{at 10:00 in the thermal load pattern generated} \\ &\text{by the thermal-load pattern generator 302} \times \\ &\text{Power consumption between 9:00 and 10:00}/ \\ &\text{Power consumption between 9:00 and 10:00 in} \\ &\text{the power consumption pattern generated by the} \\ &\text{power-consumption pattern generator 303} \end{aligned} \quad (4)$$

In the above Expression (4) the thermal load pattern generated by the thermal-load pattern generator 302 is generated based not on the thermal-load calculation sheet but on the previous actual values.

As seen from the foregoing Expression (2) compared with (4), the thermal load pattern generated by the thermal-load pattern generator 302 in the fourth embodiment corresponds to the thermal load pattern 32 of the room in the first embodiment, and the power consumption pattern generated by the power-consumption pattern generator 303 corresponds to the maximum power consumption 33 of the room in the first embodiment.

According to the fourth embodiment, using the actual power consumption of the room, and the thermal load pattern and the power consumption pattern on one day generated from the previous actual values, the thermal load estimating device 1 can estimate the thermal load of the room in real time. Furthermore, using the thermal load pattern generated from the actual values, the thermal load estimating device 1 can estimate the thermal load with higher accuracy than that in the first embodiment. Moreover, in the thermal load estimating device 1 in the fourth embodiment, the previous estimated thermal-load value of the room and the previous power consumption, which are stored in the database 301, are updated as needed while the thermal load estimating device 1 is in operation. Thus, the thermal load pattern and the power consumption pattern generated by the thermal-load pattern generator 302 and the power-consumption pattern generator 303, respectively, are also updated as needed. Thereby, the thermal load estimating device 1 in the fourth embodiment can estimate the thermal load of the room depending on the date or season with higher accuracy.

Furthermore, in the fourth embodiment, the database 301 stores the power consumption and the estimated thermal-load values of the room on the past three days, however, it may store those for the previous week instead. In storing those in the database 301 on a longer-term basis, the thermal-load pattern generator 302 may generate the thermal load pattern using the estimated thermal-load values on the same day of the week that are stored in the database 301. Likewise, the power-consumption pattern generator 303 may also generate the power consumption pattern using the power consumption on the same day of the week that is stored in the database 301.

Fifth Embodiment

Next, with reference to FIGS. 12 and 13, a fifth embodiment will be described. The functional elements identical to those illustrated in FIG. 2 and described in the first embodiment are given the same reference signs and their explanations are omitted.

Figure 12:
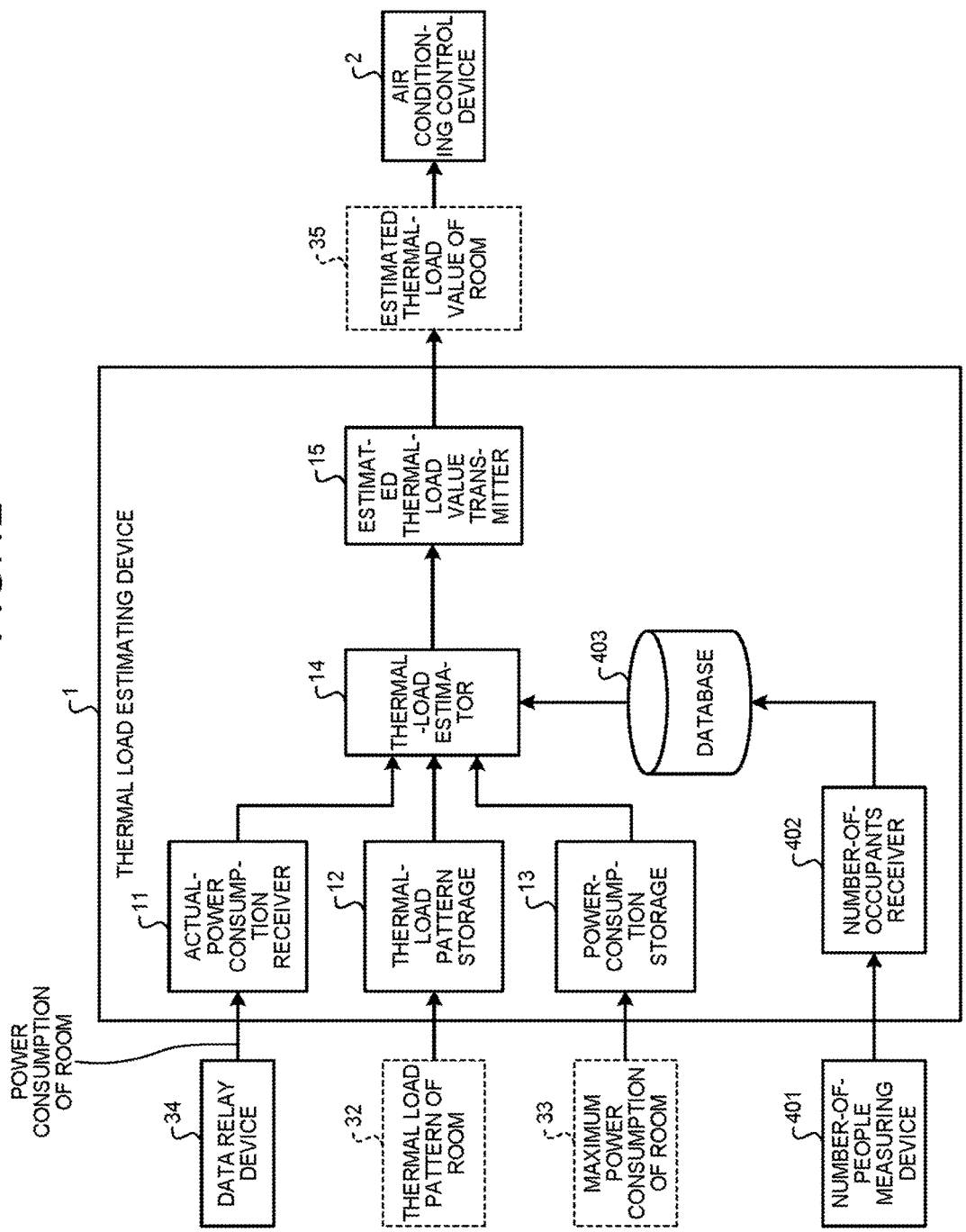
FIG. 12 is a block diagram illustrating a schematic configuration of a thermal load estimating device according to a fifth embodiment.
Figure 13:
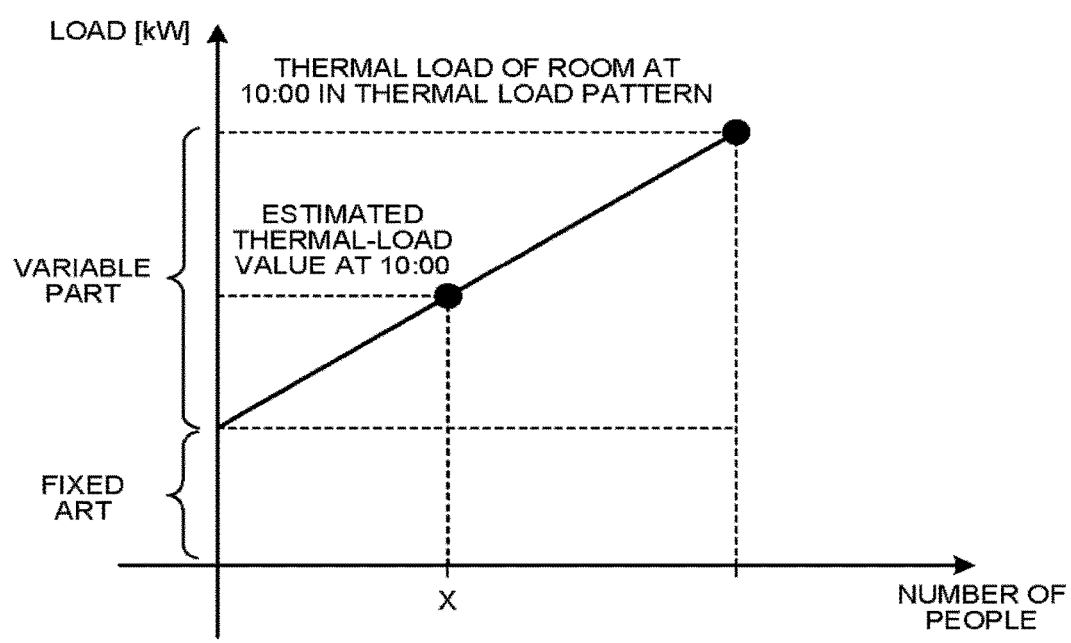
FIG. 13 is a chart illustrating the relationship between the number of occupants and the estimated thermal-load value according to the fifth embodiment.

As illustrated in FIG. 12, the thermal load estimating device 1 in the fifth embodiment includes the actual-power consumption receiver 11, the thermal-load pattern storage 12, the power-consumption storage 12, the thermal-load estimator 14, the estimated thermal-load value transmitter 15, a number-of-occupants receiver 402, and a database 403.

The number-of-occupants receiver 402 receives the number of occupants in the room from a number-of-people measuring device 401. The number-of-people measuring device 401 may be a known sensor or device such as an infrared-ray sensor that detects the entry and exit of people, a sensor that detects the number of occupants by image processing with a camera, or a device that estimates the number of occupants in the room from $CO_2$ concentration, for example.

The database 403 receives the number of occupants in the room from the number-of-occupants receiver 402 and stores therein the number of occupants as previous actual number. As an example, the database 403 stores therein the number of occupants in the room during the previous hour.

The thermal-load estimator 14 receives the power consumption of the room from the actual-power consumption receiver 11, receives the thermal load pattern of the room from the thermal-load pattern storage 12, receives the maximum power consumption of the room from the power-consumption storage 12, receives the current number of occupants in the room and the previous number of occupants in the room from the database 403, and estimates the thermal load of the room.

A specific example of a room thermal-load estimating method in the fifth embodiment will be described.

[Step 1]

First, the off-line processing unit 31 generates the thermal load pattern 32 of the room, which is the same processing as that in the first embodiment, so that its description is omitted.

[Step 2]

Next, the off-line processing unit 31 generates the maximum power consumption 33 of the room, which is the same processing as that in the first embodiment, so that its description is omitted.

[Step 3]

Next, the thermal-load estimator 14 estimates the thermal load. The thermal-load estimator 14 estimates the thermal load of the room using the thermal load pattern 32 of STEP 1, the maximum power consumption 33 of STEP 2, the power consumption of the room received by the actual-power consumption receiver 11, and the number of occupants at 10:00 and the number of occupants at 9:00 stored in the database 403. The thermal load of the room at 10:00 is estimated by the following Expression (5), for example.

$$\text{Estimated thermal-load value at 10:00} = \text{Thermal load of the room at 10:00 in the thermal load pattern } 32 \times \text{Power consumption}(E) \text{ between 9:00 and 10:00/Maximum power consumption } 33(E_{max}) \times (1 + \text{Increasing rate due to the number of occupants}) \quad (5)$$

The "increasing rate due to the number of occupants" in the Expression (5) is obtained by the following Expression (6).

$$\text{Increasing rate due to the number of occupants} = (\text{The number of occupants at 10:00/The number of occupants at 9:00}) - 1 \quad (6)$$

The Expression (5) is for estimating the thermal load of the room using the thermal load of the room at 10:00 in the thermal load pattern 32, the ratio ($E/E_{max}$) of the maximum power consumption ($E_{max}$) and actual power consumption ($E$) between 9:00 and 10:00, and using the ratio of the number of occupants at 9:00 and the current number of occupants at 10:00. The thermal load of the room is greatly influenced by the number of occupants. Thus, thermal load estimating device 1 is able to estimate the thermal load with higher accuracy from the actual power consumption of the room and the number of occupants in the room.

According to the fifth embodiment, using the actual power consumption of the room, the thermal load pattern of the room on one day generated off-line, the maximum power consumption of the room calculated off-line, the current number of occupants in the room, and the previous number of occupants in the room, the thermal load estimating device 1 can estimate the thermal load of the room in real time. In the fifth embodiment, by taking into consideration the number of occupants which largely affects the thermal load of the room, the thermal load estimating device 1 in the fifth embodiment can estimate the thermal load with higher accuracy than in the first embodiment.

The thermal-load estimator 14 in the fifth embodiment estimates the thermal load of the room by Expression (5), however, it may use the following Expression (7).

Estimated thermal-load value at 10:00=Thermal load of the room at 10:00 in the thermal load pattern 32×Power consumption (E) between 9:00 and 10:00/Maximum power consumption 33 (Emax)×(1+Increasing rate due to the number of occupants×α)   (7)

Expression (7) is for estimating the thermal load of the room using the thermal load of the room at 10:00 in the thermal load pattern 32, the ratio (E/Emax) of the maximum power consumption 33 (Emax) and the actual power consumption (E) between 9:00 and 10:00, the increasing rate due to the number of occupants which is the ratio of the number of occupants at 9:00 and the current number of occupants at 10:00, and a coefficient α. In Expression (7), the estimated thermal-load value of the room varies depending on the number of occupants. Furthermore, in Expression (7), "Thermal load of the room at 10:00 in the thermal load pattern 32×Power consumption (E) between 9:00 and 10:00/Maximum power consumption 33 (Emax)" corresponds to the fixed part illustrated in FIG. 13, and "Increasing rate due to the number of occupants×α" in parentheses corresponds to the variable part illustrated in FIG. 13. That is, α is a coefficient for adjusting the influence of the number of occupants on the variable part of the estimated thermal-load value of the room. Thus, the values of α represent a ratio of the thermal loads of various types of devices which relate to the number of occupants such as air conditioning and lighting from which the maximum thermal load in the room occur.

By Expression (7), as compared with Expression (5) and Expression (6), the rate of variation in the estimated thermal-load value due to the number of occupants can be designated. That is, even after the thermal load estimating device 1 is operated in an actual room, with a difference between the estimated thermal-load value and the actual thermal load of the room, it can readily adjust the estimated thermal-load value of the room by only changing the coefficient α in Expression (7).

Sixth Embodiment

Next, with reference to FIGS. 14 and 15, a sixth embodiment will be described. Note that the functional elements identical to those illustrated in FIG. 2 and described in the first embodiment and those illustrated in FIG. 12 and described in the fifth embodiment are given the same reference signs and their explanations are omitted.

Figure 14:
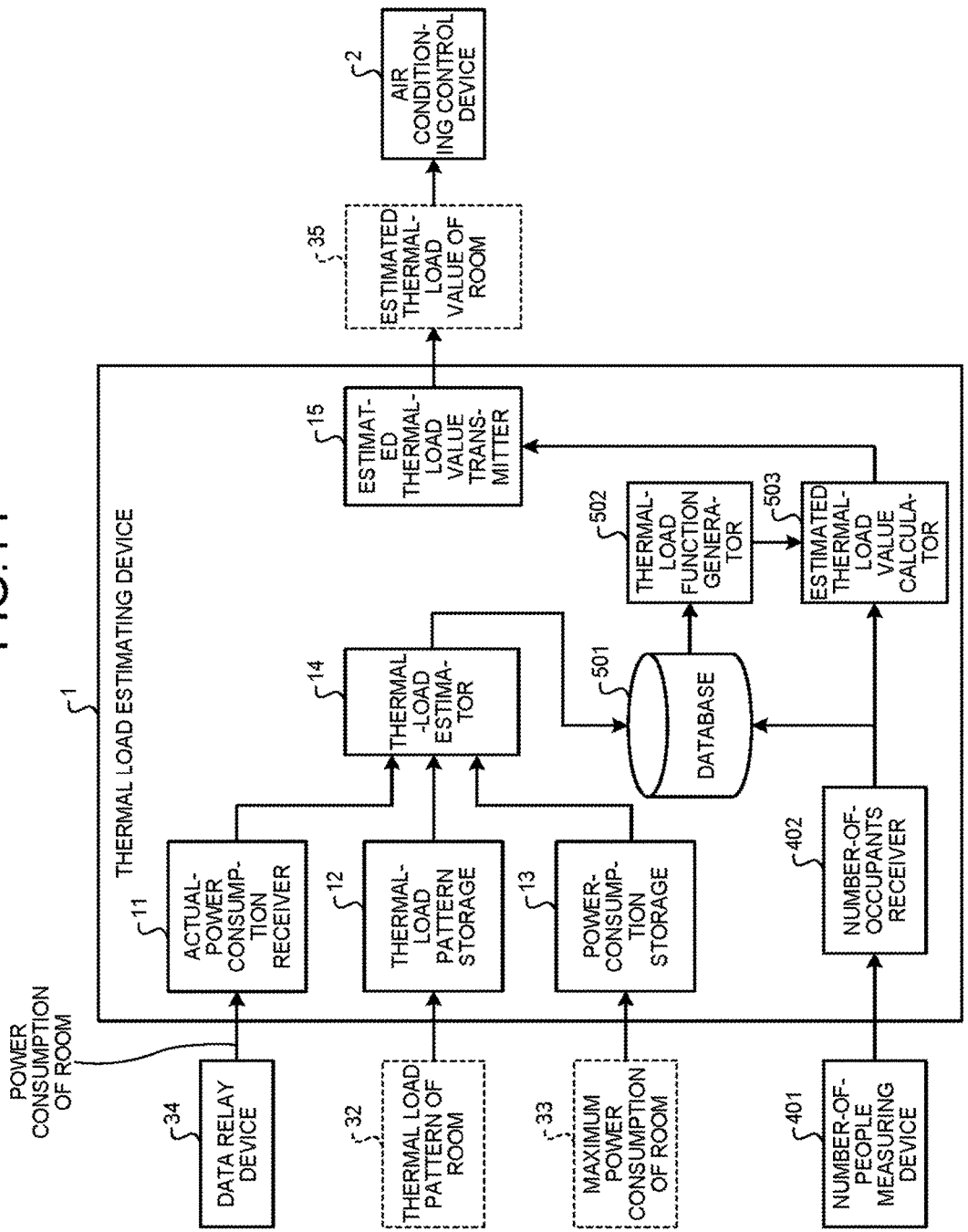
FIG. 14 is a block diagram illustrating a schematic configuration of a thermal load estimating device according to a sixth embodiment.

As illustrated in FIG. 14, the thermal load estimating device 1 in the sixth embodiment includes the actual-power consumption receiver 11, the thermal-load pattern storage 12, the power-consumption storage 13, the thermal-load estimator 14, the estimated thermal-load value transmitter 15, the number-of-occupants receiver 402, a database 501, a thermal-load function generator 502, and an estimated thermal-load value calculator 503.

The database 501 receives the estimated thermal-load value of the room from the thermal-load estimator 14, receives the number of occupants in the room from the number-of-occupants receiver 402, and stores therein the data as previous actual values. As an example, the database 501 stores therein the estimated thermal-load values of the room and the number of occupants in the room for the past three days.

Figure 15:
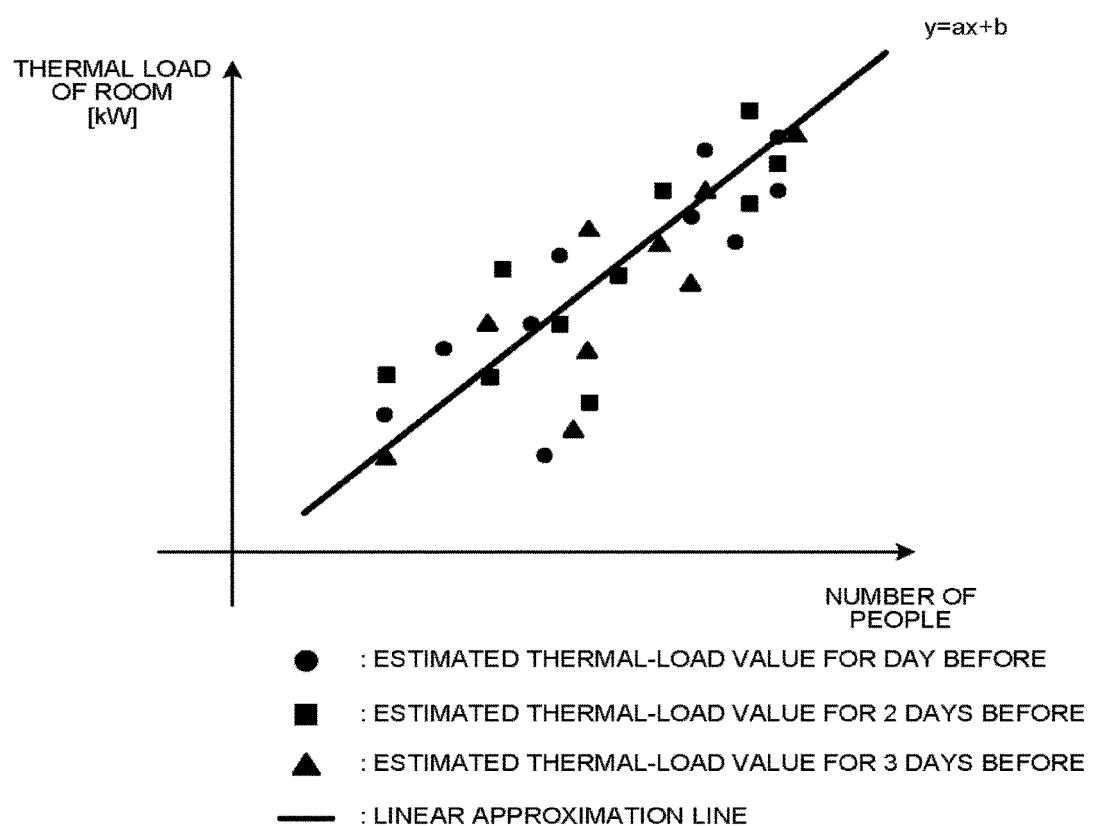
FIG. 15 is a chart illustrating an example of generation of a thermal load coefficient according to the sixth embodiment.

The thermal-load function generator 502 receives from the database 501 the previous estimated thermal-load value of the room and the data of the previous number of occupants in the room and, as illustrated in FIG. 15, from the estimated thermal-load value of the room and the number of occupants in the room, generates a thermal load function in linear approximation by a least-squares method using a linear expression as a model function, for example. In the function in FIG. 15, x represents the number of occupants in the room, y represents the estimated thermal-load value of the room, and a and b represent constants.

The estimated thermal-load value calculator 503 calculates the estimated thermal-load value of the room using the thermal load function generated by the thermal-load function generator 502 and the current number of occupants in the room from the number-of-occupants receiver 402.

As in the foregoing, the thermal load estimating device 1 in the sixth embodiment store, in the database 501, the number of occupants in the room, and the estimated thermal-load value of the room based on the actual power consumption of the room, the thermal-load pattern of the room on one day generated off-line, and the maximum power consumption of the room calculated off-line, to generate the function of the number of occupants and the thermal load of the room using the estimated thermal-load value of the room and the data of the number of occupants in the room stored in the database 501. Furthermore, using the generated thermal load function and the current number of occupants in the room, the thermal load estimating device 1 estimates the thermal load of the room in real time. The thermal load of the room greatly varies depending on the number of occupants. Thus, in the sixth embodiment, the thermal load estimating device 1 can further accurately estimate the thermal load than in the first embodiment by the function of the estimated thermal-load value and the number of occupants in the room. The estimated thermal-load value and the number of the occupants in the room stored in the database 501 are updated as needed while the thermal load estimating device 1 is in operation, thus, the thermal load function generated from the number of occupants in the room and the estimated thermal-load value of the room stored in the database 501 are also updated as needed. The thermal load estimating device 1 in the sixth embodiment can thereby estimate the thermal load of the room depending on the date or season with higher accuracy.

In the thermal load estimating device 1 in the sixth embodiment, the thermal-load function generator 502 receives from the database 501 the number of occupants and the estimated thermal-load value of the room, and generates the thermal load function by the linear approximation. Instead, it may generate the thermal load function by, for example, polynomial approximation by a least-squares method using a polynomial expression as a model function. Furthermore, the database 501 stores therein the estimated thermal-load values of the room and the number of occupants in the room for the past three days. However, the data stored in the database 501 may be in units of one week or one month.

Seventh Embodiment

Figure 16:
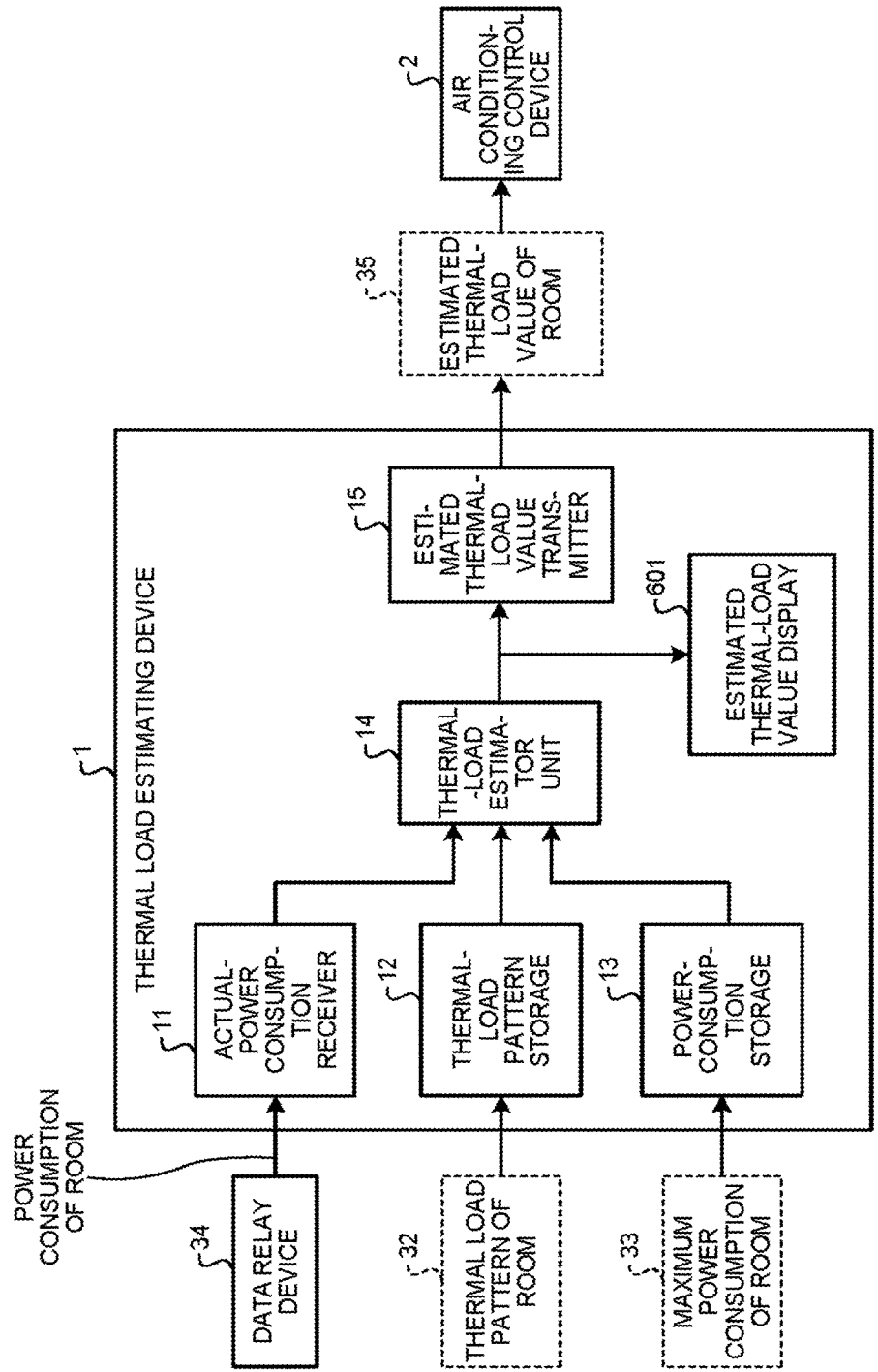
FIG. 16 is a block diagram illustrating a schematic configuration of a thermal load estimating device according to a seventh embodiment.

Next, with reference to FIG. 16, a seventh embodiment will be described. Note that the functional elements identical to those illustrated in FIG. 2 and described in the first embodiment are given the same reference signs and their explanations are omitted.

The thermal load estimating device 1 in the seventh embodiment includes the actual-power consumption receiver 11, the thermal-load pattern storage 12, the power-consumption storage unit 13, the thermal-load estimator 14, the estimated thermal-load value transmitter 15, and an estimated thermal-load value display 601.

The estimated thermal-load value display 601 displays the estimated thermal-load value of the room estimated by the thermal-load estimator 14.

The estimated thermal-load value display 601 displays on a screen the estimated thermal-load values of rooms as illustrated in FIG. 17, for example. In the example in FIG. 17, the estimated thermal-load values of the rooms are displayed in a list. In this example, displayed are not only the estimated thermal-load values but also the power consumption of the rooms received by the actual-power consumption receiver 11. As another example, as illustrated in FIG. 18, the estimated thermal-load values of the respective rooms and the power consumption of the rooms received by the actual-power consumption receiver 11 may be displayed in a plan view of a building.

According to the seventh embodiment same as the first embodiment, using the actual power consumption of the room, the thermal load pattern of the room on one day generated off-line, and the maximum power consumption of the room calculated off-line, the thermal load estimating device 1 can estimate the thermal load of the room in real time. In addition, the thermal load estimating device 1 can display the estimated thermal-load values to visualize the thermal load. This makes it possible for an occupant in the room to check the thermal load in real time and to easily operate the air conditioning control system 10 efficiently in accordance with the usage of the room.

As in the foregoing, the thermal load estimating device 1 in the first to the seventh embodiments can estimate the thermal load in units of a room in real time. Furthermore, the thermal load estimating device 1 can estimate the thermal load of the room easily, simply using the thermal load pattern generated at the time of designing the air conditioning equipment or the thermal load pattern based on the actual data, the maximum power consumption obtainable from the rated values of the various types of devices, and the typically measured power consumption, without acquiring weather forecast information or measuring the supply-air temperature and air volume of the air conditioner 41. Hence, it can accommodate to a variety of buildings and rooms.

The thermal-load estimator 14 and the estimated thermal-load value calculator 503 may be structured as dedicated hardware, or may include a computer including a control device such as CPU and a memory device such as read only memory (ROM) or RAM, and a control program therefor.

While a number of embodiments of the invention have been exemplified in the foregoing, those embodiments are presented as mere examples and are not intended to limit the scope of the invention. Those novel embodiments can be implemented in various other forms and, without departing from the scope of the invention, various omissions, substitutions, and modifications can be performed. Those embodiments and the modifications thereof are included in the scope and spirit of the invention and are included in the scope of the invention stated in the appended claims and the scope of the equivalents thereof.

The invention claimed is:

1. A thermal load estimator, comprising:
   a processor that
   receives an actual power consumption of various types of devices installed in a room;
   stores therein a predetermined thermal load pattern, the thermal load pattern representing a maximum thermal load at each of certain times of day based on least one selected from the group consisting of a human-body thermal load, a lighting thermal load, or an insolation load in the room;
   stores therein a maximum power consumption that is a total value of respective maximum values of the power consumption of the various types of devices in the room calculated from rated values of the various types of devices in the room;
   estimates a thermal-load value of the room at a certain time of day subsequent to a time at which the actual power consumption has been measured, based on the actual power consumption at the time at which the actual power consumption has been measured, the thermal load pattern, and the maximum power consumption; and
   transmits the estimated thermal-load value estimated by the thermal-load estimator to an air conditioning control device that controls an air-conditioning and heat source system including an air conditioner and a heat source unit.

2. The thermal load estimator according to claim 1, wherein the processor
   determines an occurrence of an anomaly or missing data in the actual power consumption of the room; and
   stores an estimated thermal-load value previously transmitted, and transmits the stored previous estimated thermal-load value to the air conditioning control device when determining the occurrence of the anomaly or missing data in the received actual power consumption of the room.

3. The thermal load estimator according to claim 1, wherein the processor
   defines a designated specific time period and a designated thermal load in the specific time period; and
   selects and outputs the designated thermal load during the designated specific time period, and selects and outputs, as a thermal load, an estimated thermal-load value for a non-designated time period during the non-designated time period.

4. The thermal load estimator according to claim 1, further comprising:
   a database that stores therein the actual power consumption of various types of devices in the room received by the processor and the estimated thermal-load value of the room transmitted by the processor;
   wherein the processor
   generates a one-day power consumption pattern based on the actual power consumption of the room stored in the database;
   generates a one-day thermal load pattern based on the estimated thermal-load value of the room stored in the database, and estimates the thermal load of the room based on the actual power consumption received by the processor, the power consumption pattern generated by the processor, and the thermal load pattern generated by the processor.

5. The thermal load estimator according to claim 4, wherein the processor generates a thermal load pattern using estimated thermal-load values of the room on a same day of the week stored in the database, and generates an electric energy pattern using actual power consumption of the room on the same day of the week stored in the database.

6. The thermal load estimator according to claim 1, wherein the processor receives the number of occupants in the room from a sensor, the thermal load estimator further comprising a database that stores therein past data on the number of occupants in the room received by the processor, wherein the processor estimates the thermal load of the room based on the actual power consumption of the room, the stored thermal load pattern of the room, the stored maximum power consumption of the room, and an increasing rate calculated from the received number of occupants in the room and the past data on the number of occupants in the room stored in the database.

7. The thermal load estimator according to claim 6, wherein the sensor is an infrared sensor that detects entry and exit of an occupant, a number-of-occupants sensor using a camera, or a device that estimates the number of occupants in the room from $CO_2$ concentration of the room.

8. The thermal load estimator according to claim 6, wherein the processor estimates the thermal load of the room using a coefficient for adjusting the influence of the number of occupants on the estimated thermal-load value of the room.

9. The thermal load estimator according to claim 6, wherein the database further stores therein the estimated thermal-load value of the room estimated by the processor, wherein the processor generates a thermal load function based on the estimated thermal-load value of the room and the past data on the number of occupants in the room stored in the database, the thermal load function being based on an approximation function representing a relationship between the estimated thermal-load value of the room and the number of occupants in the room, and calculates the estimated thermal-load value of the room from the generated thermal load function and from the received number of occupants in the room.

10. The thermal load estimator according to claim 1, comprising an estimated thermal-load value display that displays the estimated thermal-load value of the room.

11. An air conditioning control system comprising:

a thermal load estimator comprising:

a processor that receives an actual power consumption of various types of devices installed in a room;

stores therein a predetermined thermal load pattern, the thermal load pattern representing a maximum thermal load at each of certain times of day based on least one selected from the group consisting of of a human-body thermal load, a lighting thermal load, and an insolation load in the room;

stores therein a maximum power consumption that is a total value of respective maximum values of the power consumption of the various types of devices in the room calculated from the rated values of the various types of devices in the room;

estimates a thermal-load value of the room at a certain time of day subsequent to a time at which the actual power consumption has been measured, based on the actual power consumption at the time at which the actual power consumption has been measured, the thermal load pattern, and the maximum power consumption; and transmits the estimated thermal-load value estimated to an air conditioning control device that controls an air-conditioning and heat source system including an air conditioner and a heat source unit; and the air conditioning control device that comprises a processor that receives the estimated thermal-load value of the room transmitted from the thermal load estimator and controls the air-conditioning and heat source system including an air conditioner and a heat source unit.

* * * * *

UNITED STATES PATENT AND TRADEMARK OFFICE
CERTIFICATE OF CORRECTION

PATENT NO. : 10,393,396 B2
APPLICATION NO. : 15/117675
DATED : August 27, 2019
INVENTOR(S) : Shingo Tamaru et al.

Page 1 of 1

It is certified that error appears in the above-identified patent and that said Letters Patent is hereby corrected as shown below:

On the Title Page

Item (71), the Applicant's city is missing. Item (71) should read:
-- (71) Applicant: Kabushiki Kaisha Toshiba, Minato-ku (JP) --

Signed and Sealed this
Fourth Day of February, 2020

Andrei Iancu
*Director of the United States Patent and Trademark Office*